(12) United States Patent
Fertig

(10) Patent No.: US 7,915,129 B2
(45) Date of Patent: Mar. 29, 2011

(54) METHOD OF FABRICATING HIGH-VOLTAGE METAL OXIDE SEMICONDUCTOR TRANSISTOR DEVICES

(75) Inventor: Daniel J. Fertig, Edina, MN (US)

(73) Assignee: Polar Semiconductor, Inc., Bloomington, MN (US)

( * ) Notice: Subject to any disclaimer, the term of this patent is extended or adjusted under 35 U.S.C. 154(b) by 58 days.

(21) Appl. No.: 12/427,989

(22) Filed: Apr. 22, 2009

(65) Prior Publication Data
US 2010/0270625 A1 Oct. 28, 2010

(51) Int. Cl.
*H01L 21/336* (2006.01)
(52) U.S. Cl. ........ 438/299; 438/197; 257/288; 257/346; 257/387
(58) Field of Classification Search .................. 257/141, 257/327, 335, 343, 347, 492; 438/299, 479
See application file for complete search history.

(56) References Cited

U.S. PATENT DOCUMENTS

| | | | |
|---|---|---|---|
| 4,305,085 A | 12/1981 | Jaecklin et al. | |
| 5,441,902 A | 8/1995 | Hsieh et al. | |
| 5,489,543 A | 2/1996 | Hong | |
| 5,663,086 A | 9/1997 | Rostoker et al. | |
| 5,786,255 A | 7/1998 | Yeh et al. | |
| 5,858,848 A | 1/1999 | Gardner et al. | |
| 5,915,181 A | 6/1999 | Tseng | |
| 5,915,183 A | 6/1999 | Gambino et al. | |
| 6,107,140 A | 8/2000 | Lee et al. | |
| RE37,104 E | 3/2001 | Doan et al. | |
| 6,284,586 B1 | 9/2001 | Seliskar et al. | |
| 6,624,068 B2 | 9/2003 | Thakar et al. | |
| 6,657,257 B2 * | 12/2003 | Ohyanagi et al. ............. 257/347 |
| 6,661,061 B1 | 12/2003 | Gardner et al. | |
| 6,887,772 B2 * | 5/2005 | Lee et al. ...................... 438/479 |
| 6,927,154 B2 | 8/2005 | Graf et al. | |
| 6,958,515 B2 * | 10/2005 | Hower et al. .................. 257/341 |
| 7,045,422 B2 | 5/2006 | Enders et al. | |
| 7,271,073 B2 | 9/2007 | Van Haren et al. | |
| 7,374,980 B2 | 5/2008 | Anderson et al. | |
| 7,618,870 B2 * | 11/2009 | Pan et al. ...................... 438/306 |
| 2002/0055233 A1 * | 5/2002 | Mitros .......................... 438/299 |
| 2007/0032083 A1 | 2/2007 | Choi | |
| 2008/0160771 A1 | 7/2008 | Yu et al. | |

* cited by examiner

*Primary Examiner* — Thanh V Pham
*Assistant Examiner* — Errol Fernandes
(74) *Attorney, Agent, or Firm* — Kinney & Lange, P.A.

(57) ABSTRACT

A process of fabricating a transistor employs a relatively thicker sacrificial nitride layer that reduces the time and cost associated with chemical-mechanical polish (CMP) processes by reducing the topography associated with the transistor. The process includes forming the gate oxide region and a field oxide region on a substrate. A polysilicon layer is formed on the gate oxide region and the field oxide region. A sacrificial nitride layer is formed on the polysilicon layer, wherein the sacrificial nitride layer has a thickness approximately equal to or greater than a thickness of the gate oxide region. A polysilicon gate is formed by selectively removing portions of the polysilicon layer and the sacrificial layer to expose a portion of the gate oxide region adjacent to the polysilicon gate. Source/drain regions are formed adjacent to the polysilicon gate using lightly-doped drain (LDD) implantation. A spacer layer is formed over the polysilicon gate and source/drain regions. Portions of the spacer layer are selectively removed, along with the sacrificial nitride layer and the gate oxide region to form sidewall spacers at each end of the polysilicon gate. A pre-metal dielectric layer is formed on the high-voltage MOS transistor, and the pre-metal dielectric layer is planarized.

12 Claims, 5 Drawing Sheets

METHOD OF FABRICATING HIGH-VOLTAGE METAL OXIDE SEMICONDUCTOR TRANSISTOR DEVICES

BACKGROUND

The present invention relates to fabrication of metal oxide semiconductor (MOS) transistors, and in particular to a method for processing high-voltage MOS transistors.

High-voltage MOS transistors require a relatively thick gate oxide defined between adjacent source/drain regions, as compared with typical MOS transistors. For instance, a high-voltage MOS transistor may employ a gate oxide thickness of approximately 600 Angstroms (Å), whereas a typical MOS transistor may employ a gate oxide thickness of 100-150 Å or less. The thicker gate oxide, which is typically present over the source/drain regions, complicates lightly-doped-drain (LDD) implantation used to create the lightly-doped drain and source regions. The polysilicon gate is sufficient for typical MOS transistors to block LDD implantation in the channel region underlying the polysilicon gate. However, the higher energy LDD implantation required by the thicker gate oxide for high-voltage MOS transistors may result in LDD implantation beneath the polysilicon gate. This issue is resolved in the prior art by increasing the thickness of the gate polysilicon layer, which acts to block LDD implantation from the underlying channel region while creating the desired profile in the adjacent source/drain regions.

Increasing the thickness of the gate polysilicon region, however, adds to the overall topography (i.e., unevenness associated with the surface) of the device. The increased topography, from a practicality standpoint, precludes use of chemical-mechanical polishing (CMP) to planarize the subsequent pre-metal dielectric layers on the wafer. A resist etch back planarization process is used instead, but does not provide so planar a surface as the CMP process.

It would be beneficial for a fabrication process directed to high-voltage MOS devices, which require a relatively thick gate oxide layer, to also include a relatively thin polysilicon layer that is conducive to CMP planarization.

SUMMARY

The present invention relates, in one aspect, to a method of forming a metal oxide semiconductor (MOS) transistor and transistors formed according to the defined process. The method includes forming a gate oxide region and a field oxide region on a substrate. A polysilicon layer is formed on the gate oxide region and the field oxide region. A sacrificial nitride layer is formed on the polysilicon layer, wherein the sacrificial nitride layer has a thickness approximately equal to or greater than a thickness of the gate oxide region. A polysilicon gate is formed by selectively removing portions of the polysilicon layer and the sacrificial layer to expose a portion of the gate oxide region adjacent to the polysilicon gate. Source/drain regions are formed adjacent to the polysilicon gate using lightly-doped drain (LDD) implantation. A spacer layer is formed over the polysilicon gate and source/drain regions. Portions of the spacer layer are selectively removed, along with the sacrificial nitride layer and the gate oxide region to form sidewall spacers at each end of the polysilicon gate. A pre-metal dielectric layer is formed on the high-voltage MOS transistor, and the pre-metal dielectric layer is planarized.

The present invention relates, in another aspect, to a process for forming a metal oxide semiconductor (MOS) transistor and transistors formed according to the defined process. The method includes forming a gate oxide region and a field oxide region on a substrate. A polysilicon layer is formed on the gate oxide region and the field oxide region. A sacrificial nitride layer is formed on the polysilicon layer. A polysilicon gate is formed by selectively removing portions of the polysilicon layer and the sacrificial layer to expose a portion of the gate oxide region adjacent to the polysilicon gate. Source/drain regions are formed adjacent to the polysilicon gate using lightly-doped drain (LDD) implantation, wherein a combined thickness of the polysilicon layer and the sacrificial nitride layer is sufficient to protect a channel region underlying the polysilicon gate from LDD implantation. A spacer layer is formed over the polysilicon gate and source/drain regions. Portions of the spacer layer are selectively removed, along with the sacrificial nitride layer and the gate oxide region to form sidewall spacers at each end of the polysilicon gate. A pre-metal dielectric layer is formed on the high-voltage MOS transistor, and the pre-metal dielectric layer is planarized.

In addition, the present invention relates to transistors comprised of a silicon substrate, a gate formed on the silicon substrate, and source/drain regions formed adjacent to the gate. The gate includes a gate oxide region formed over an underlying channel region and a polysilicon layer formed over the gate oxide region, wherein the polysilicon layer has a thickness equal to or less than three times a thickness of the gate oxide region.

DETAILED DESCRIPTION

The present invention employs a thick, sacrificial nitride layer on top of a gate polysilicon layer. During lightly-doped drain (LDD) implantation, the sacrificial nitride layer, in combination with a thin polysilicon layer, prevents LDD implantation in the channel underlying the polysilicon gate. During removal of spacer material used to form sidewall spacers adjacent to the polysilicon gate, the sacrificial nitride layer is removed along with the gate oxide layer located over the source/drain regions. The resulting topography defined by the height between the top of the source/drain region and the top of the polysilicon gate is reduced as compared with prior art processes that require a thick polysilicon layer to block LDD implantation. A benefit of the reduced topography is a reduction in costs associated with the planarization of the pre-metal dielectric layer.

FIGS. 1A-1J are diagrams illustrating the fabrication of high-voltage NMOS transistor 10 according to an embodiment of the present invention. In this embodiment, silicon substrate 11 is doped p-type, although for a PMOS transistor silicon substrate 11 would be doped n-type. It should be noted, the diagrams provided in FIGS. 1A-1J are not true cross-sectional views of NMOS transistor 10, but rather are hybrid cross-sectional views used to illustrate relative heights associated with various layers as well as the location of the gate relative to source/drain regions. Typically, cross-sections of NMOS transistors illustrate source/drain regions formed on opposite sides of the gate. In FIGS. 1A-1J, a single source/drain region is illustrated on one side of the gate, for purposes of illustrating the topography of the transistor.

Figure 1A:
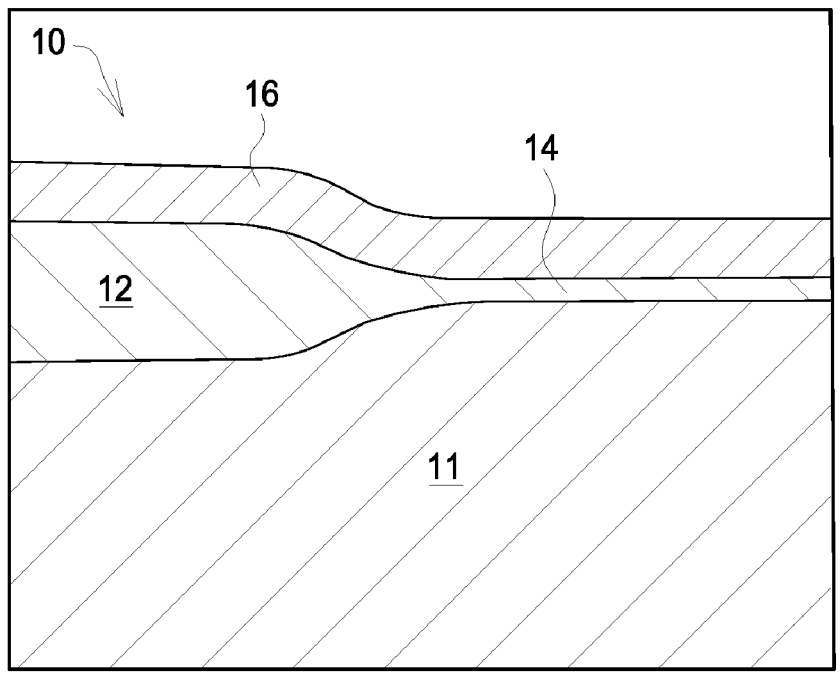
FIGS. 1A-1J are diagrams illustrating the fabrication of an NMOS transistor on a silicon wafer according to an embodiment of the present invention.

FIG. 1A illustrates NMOS transistor 10 following growth of field oxide region 12, gate oxide region 14, and subsequent deposition of polysilicon layer 16. Gate oxide 14 is defined by a thickness $n_1$ and polysilicon layer 16 is defined by a thickness $n_2$. For a typical five-Volt transistor, the thickness $n_1$ associated with gate oxide 14 may be approximately 100-135 Å. For a high-voltage transistor the thickness $n_1$ of gate oxide 14, which provides isolation between the gate and body of the transistor, is increased (e.g., 400 Å or more). The increase in thickness of gate oxide 14 requires an increase in the energy of a subsequent LDD implantation for formation of source/drain regions. This is typically not problematic, as the thickness $n_2$ of polysilicon layer 16 is sufficient to block LDD implantation in the channel region underlying the gate. The present invention, however, seeks to minimize the thickness $n_2$ of polysilicon layer to decrease the overall topography of the wafer and allow for CMP planarization. The present invention is particularly applicable to embodiments in which the thickness ($n_2$) of the polysilicon layer is less than or equal to three times the thickness ($n_1$) of the gate oxide region. For example, in an application in which the thickness $n_1$ of gate oxide 14 is 500 Å, the thickness $n_2$ of gate polysilicon layer 16 will be 1500 Å or less.

Figure 1B:
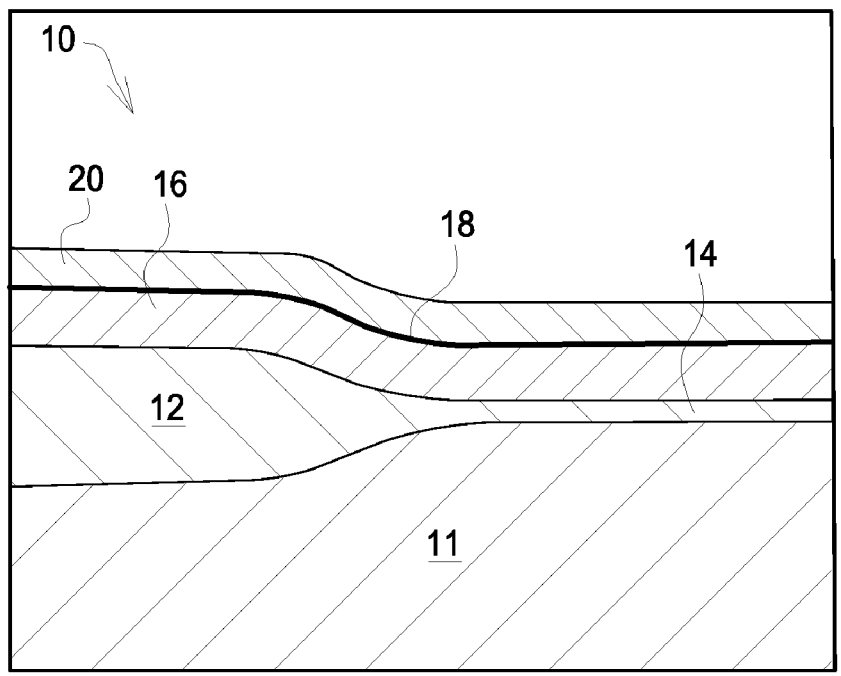

FIG. 1B illustrates NMOS transistor 10 following growth of thin oxide layer 18 and deposition of sacrificial nitride layer 20, which is defined by a thickness $n_3$. In contrast with traditional fabrication processes, in which an etch resistant nitride cap layer having a relatively small thickness is deposited over the polysilicon layer to act as a hard mask during definition (i.e., etch) of the polysilicon gate, the present invention increases the thickness $n_3$ of sacrificial nitride layer 20 to block LDD implantation over channel underlying the polysilicon gate (described with respect to FIG. 1C) and to prevent undesirable etching of gate polysilicon layer 16 (described with respect to FIG. 1G).

The thickness $n_3$ of sacrificial nitride layer 20 is selected based on the relative thickness of gate oxide layer 14 ($n_1$) and/or the relative thickness of polysilicon layer 16 ($n_2$). For example, in one embodiment the thickness $n_3$ of sacrificial nitride layer 20 is defined relative to the thickness $n_1$ of gate oxide 14, wherein the thickness ($n_3$) associated with sacrificial nitride layer 20 is less than or equal to twice the thickness ($n_1$) of gate oxide region 14 but greater than or equal to the thickness (n1) of gate oxide region 14, as defined by the following equation.

$$n_1 \leq n_3 \leq n_1 * 2, \text{ wherein } n_1 \text{ is greater than 400 Å} \quad (1)$$

Figure 1C:
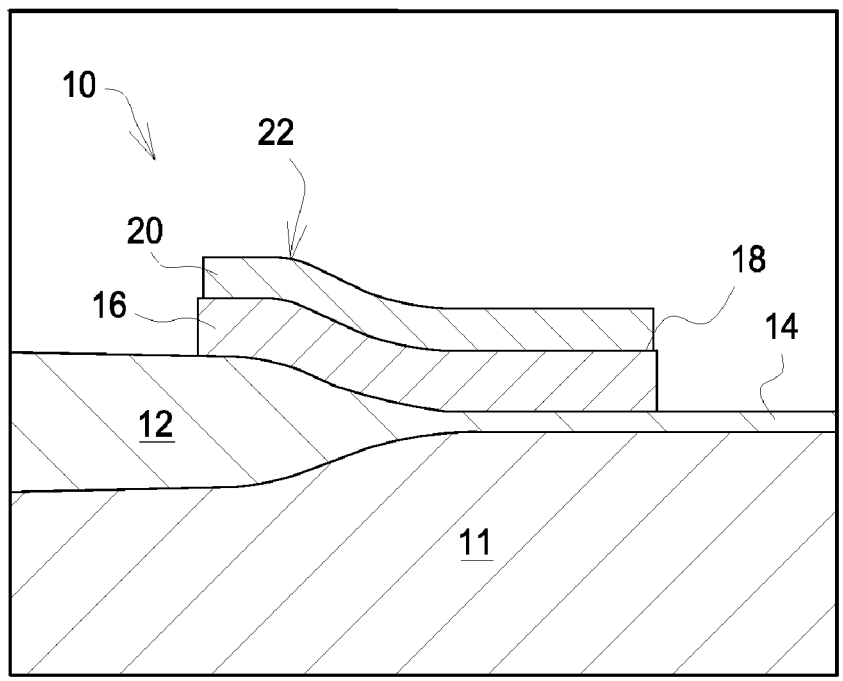

FIG. 1C illustrates NMOS transistor 10 following definition of polysilicon gate 22, in which polysilicon layer 16, thin oxide layer 18, and sacrificial nitride layer 20 are selectively removed. In the area adjacent polysilicon gate 22, gate oxide region 14 is exposed for subsequent n-type LDD implantation.

Figure 1D:
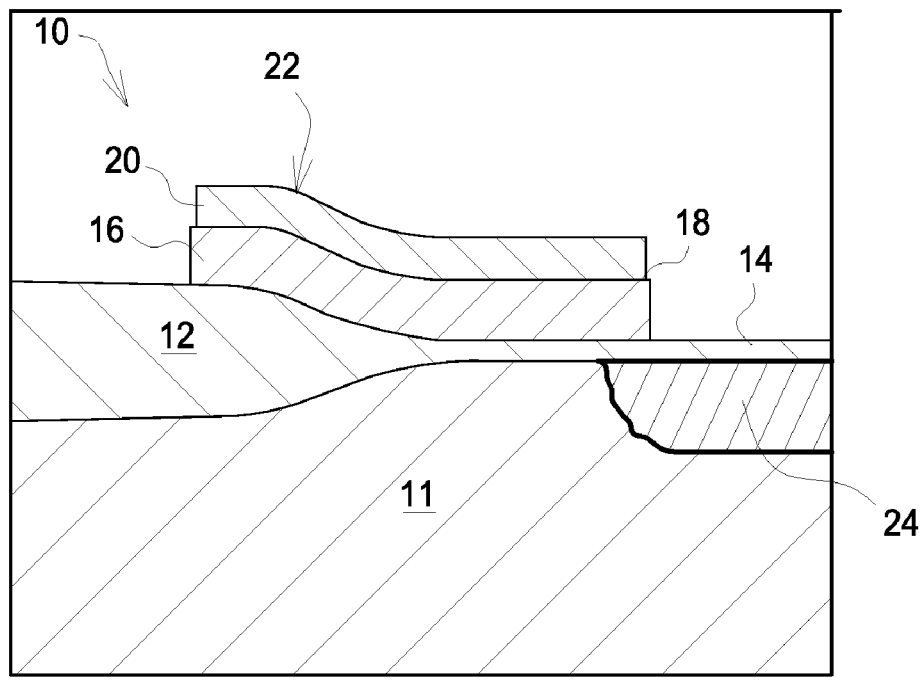

FIG. 1D illustrates NMOS transistor 10 following n-type LDD implantation to create source/drain region 24 (i.e., junctions) adjacent to polysilicon gate 22. Sacrificial nitride layer 20 and polysilicon layer 16 block LDD implantation in the channel underlying polysilicon gate 22. The ability to block LDD implantation in the channel is dependent, in part, on the total thickness of polysilicon layer 16 and sacrificial nitride layer 20. The increased thickness $n_3$ of sacrificial nitride layer 20, in combination with the thickness $n_2$ of polysilicon layer 16 prevents LDD implantation in the channel region underlying polysilicon gate 22.

The success of LDD implantation is defined, in part, by the relative thicknesses of gate oxide region 14 ($n_1$), polysilicon layer 16 ($n_2$), and sacrificial nitride layer 20 ($n_3$), as defined by the following ratio:

$$(n1+n2+n3)/n1 \quad (2)$$

This ratio is based on the thickness of sacrificial nitride layer 20 ($n_3$), polysilicon layer 16 ($n_2$), and gate oxide 14 ($n_1$), which act to block LDD implantation over the channel region underlying polysilicon gate 22, and the thickness of gate oxide 14 ($n_1$) located over source/drain region 24. A higher ratio indicates more protection for the underlying channel region, and is therefore beneficial. In high-voltage applications, in which the thickness $n_1$ of gate oxide 14 is increased from approximately 100-130 Å to 400 Å or more, the resulting ratio for typical thicknesses of polysilicon layer 16 and sacrificial nitride layer 20 is lower than desired. As described above, one method employed in the prior art to improve this ratio is to increase the thickness $n_2$ of polysilicon layer 16. However, the present invention avoids significantly increasing the thickness $n_2$ of polysilicon layer 16 by instead increasing the thickness $n_3$ of sacrificial nitride layer 20. Because sacrificial nitride layer 20 is removed in a subsequent step, the thickness of nitride layer 20 does not increase the topography of the overall wafer. In this way, the ratio is increased to a desired value, while maintaining polysilicon layer 16 at a thickness $n_2$ that will not significantly increase the topography of the wafer.

Figure 1E:
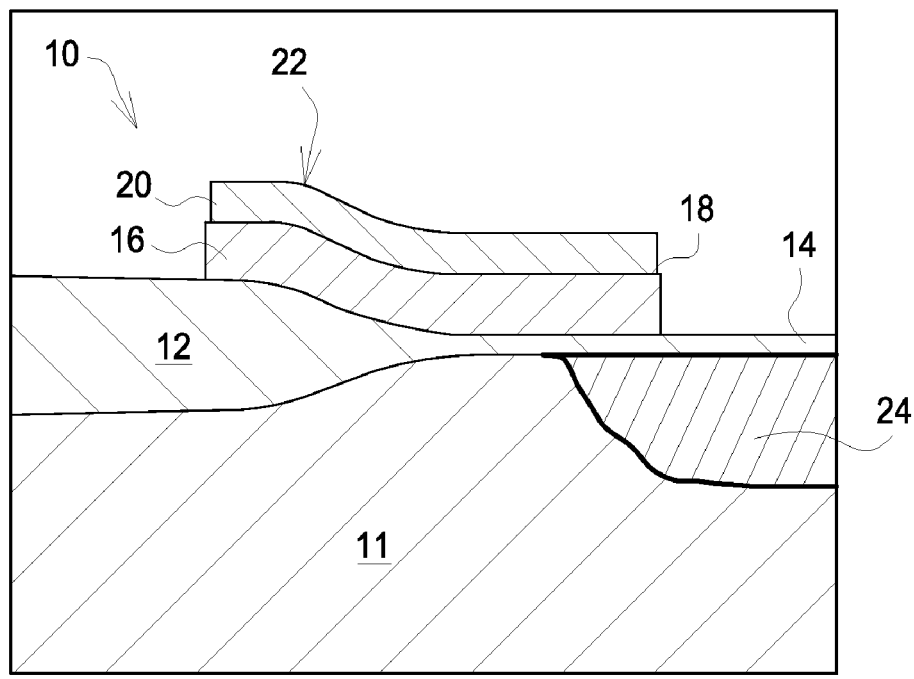

FIG. 1E illustrates NMOS transistor 10 following furnace drive-in of the lightly-doped portion of source/drain region 24. Furnace drive-in of source/drain region 24 is controlled to select a desired depth associated with source/drain region 24. As a result of the furnace drive-in of source/drain region 24, the depth of the implanted n-type dopants into the silicon substrate is increased.

Figure 1F:
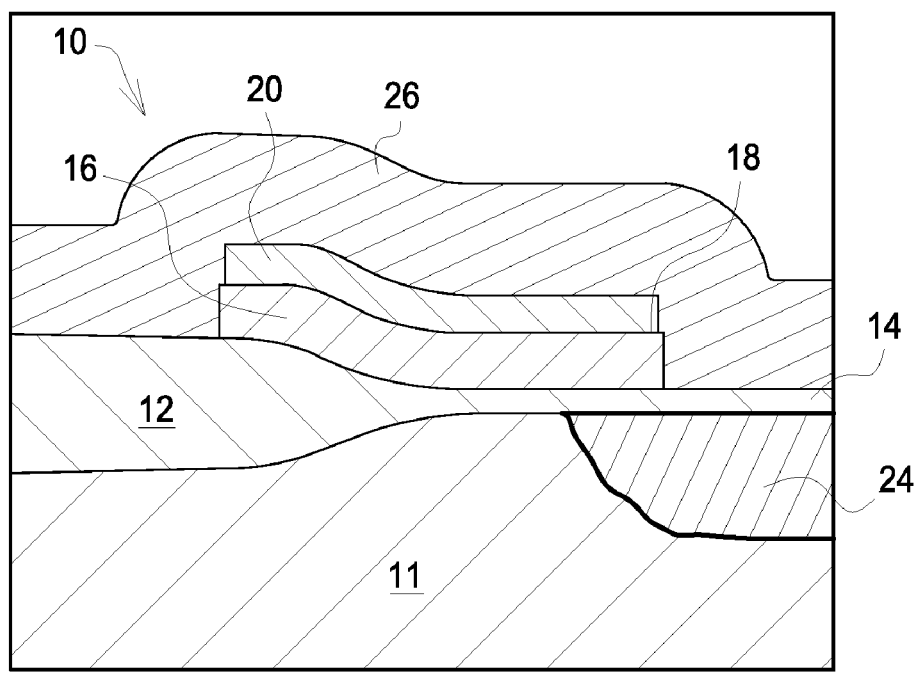

FIG. 1F illustrates NMOS transistor 10 following deposition of spacer material 26. In one embodiment, spacer material 26 is silicon dioxide, silicon nitride, or a combination thereof.

Figure 1G:
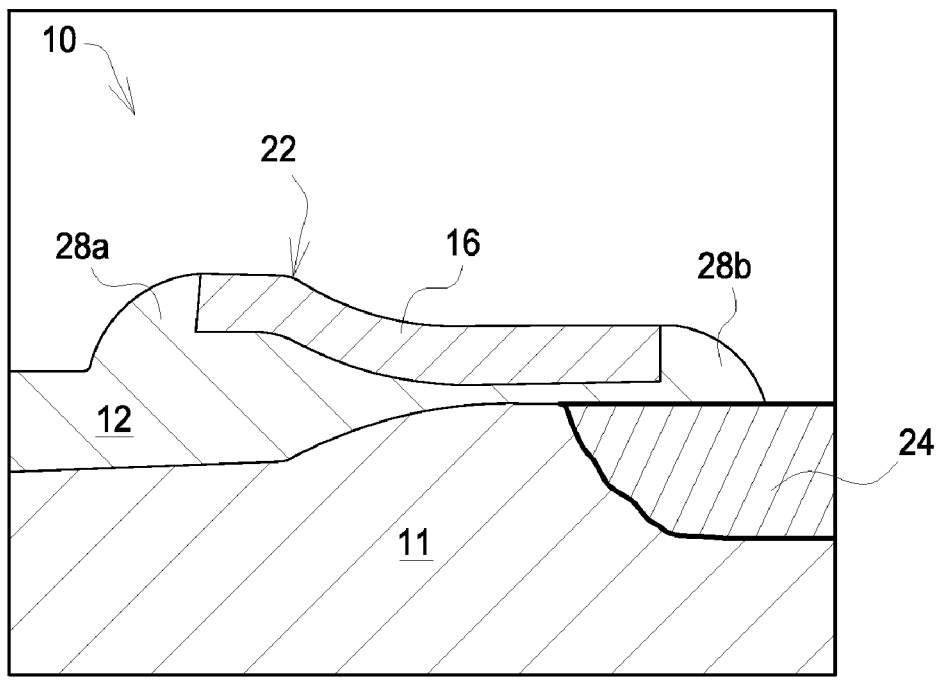

FIG. 1G illustrates NMOS transistor 10 following removal of spacer material 26 to form sidewall spacers 28a and 28b on either side of polysilicon gate 22. In one embodiment, removal of spacer material 26 is done with an anisotropic etch that includes removal of both gate oxide 14 and sacrificial nitride layer 20. Preferably, removal of gate oxide 14 and nitride layer 20 is completed at the same time, with little or no significant etching of polysilicon layer 16. In particular, in applications in which an initial thickness associated with polysilicon layer 16 is relatively thin (e.g., 1500 Å), etching of any portion of the polysilicon layer may result in the device being inoperable.

Proper selection of the etch chemistry based on the thicknesses of sacrificial nitride layer 20 ($n_3$) and gate oxide 14 ($n_1$) results in both layers being etched through at approximately the same time without any etching or erosion of polysilicon layer 16. For example, in one embodiment the thickness of sacrificial nitride layer 20 ($n_3$) is approximately twice the thickness of gate oxide 14 ($n_1$). To prevent etching of polysilicon layer 16, the etch chemistry is selected to remove sacrificial nitride layer 20 at approximately twice the rate of gate oxide layer 14. As a result, removal of sacrificial nitride layer 20 coincides with removal of gate oxide layer 14. In other embodiments, depending on the ratios between the thickness of each layer, various chemistries may be used to form sidewall spacers 28a and 28b, and remove sacrificial nitride layer 20 and gate oxide layer 14.

Figure 1H:
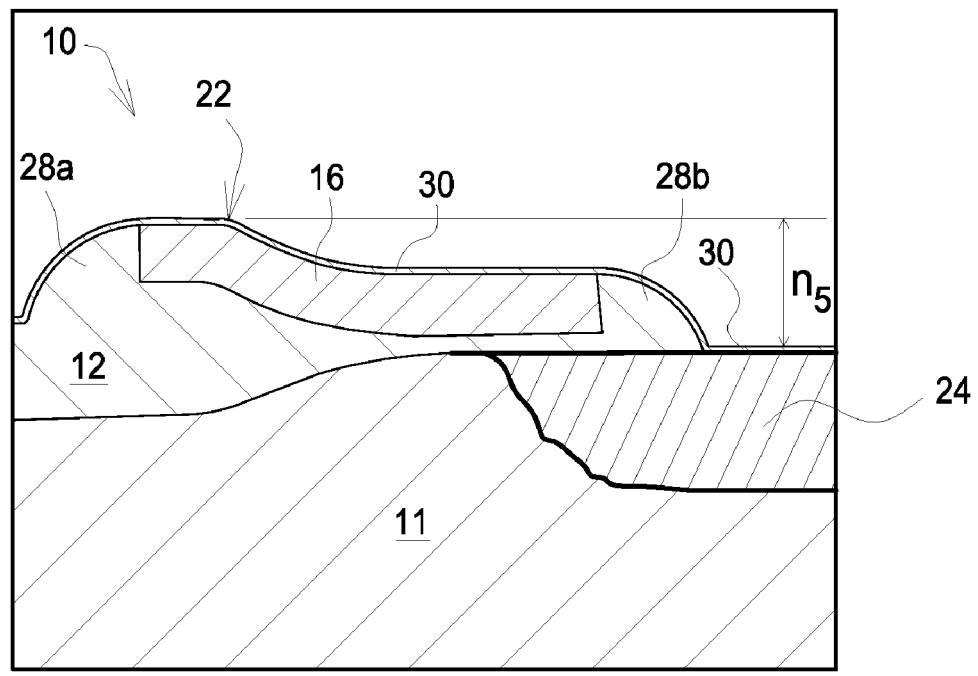

FIG. 1H illustrates NMOS transistor 10 following growth of thin oxide 30 over source/drain region 24. The topography associated with the wafer is defined by the difference in height (i.e., step height $n_5$) between the top of source/drain region 24 and the top of polysilicon layer 16. A benefit of employing sacrificial nitride layer 20 having a relatively large thickness (e.g., twice the thickness of the gate oxide layer) is the thickness of polysilicon layer 16 remains relatively thin (relative to prior art high-voltage devices). As a result, the step height $n_5$ defined between source/drain region 24 and polysilicon layer 16 is less than that provided in the prior art.

In some embodiments, a heavily-doped region (not shown) is implanted and annealed in drain region 24 following growth of thin oxide 30 to lower the resistance between lightly-doped drain region 24 under spacer 28b and an ohmic contact to metal interconnects (not shown). Although the heavily-doped region does not affect step height $n_5$ defined between source/drain region 24 and polysilicon layer 16 and is therefore not shown explicitly.

Figure 1I:
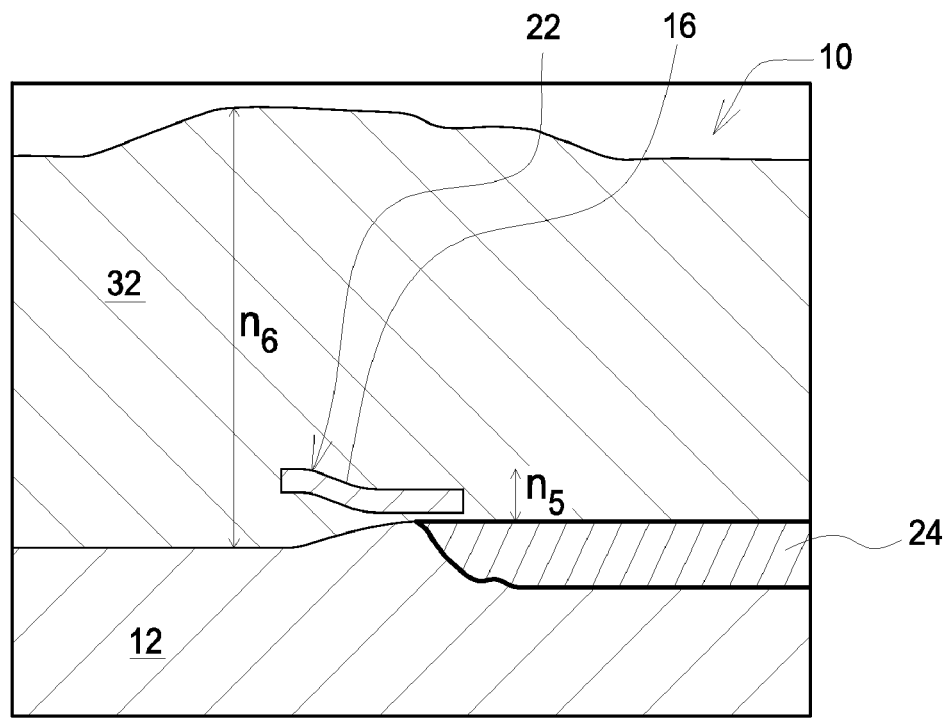

FIG. 1I illustrates NMOS transistor 10 following deposition of pre-metal dielectric layer 32 over the entire wafer. Variations in the height of pre-metal dielectric layer 32 are a direct result of the step height $n_5$ (i.e., the topography associated with the wafer). The thickness $n_6$ associated with pre-metal dielectric layer 32 increases at a rate greater than that of step height $n_5$. Decreasing the step height $n_5$ therefore decreases both the height and topography associated with pre-metal dielectric layer 32. A benefit of a decreased height and topography is that less material needs to be removed during the planarization process.

Figure 1J:
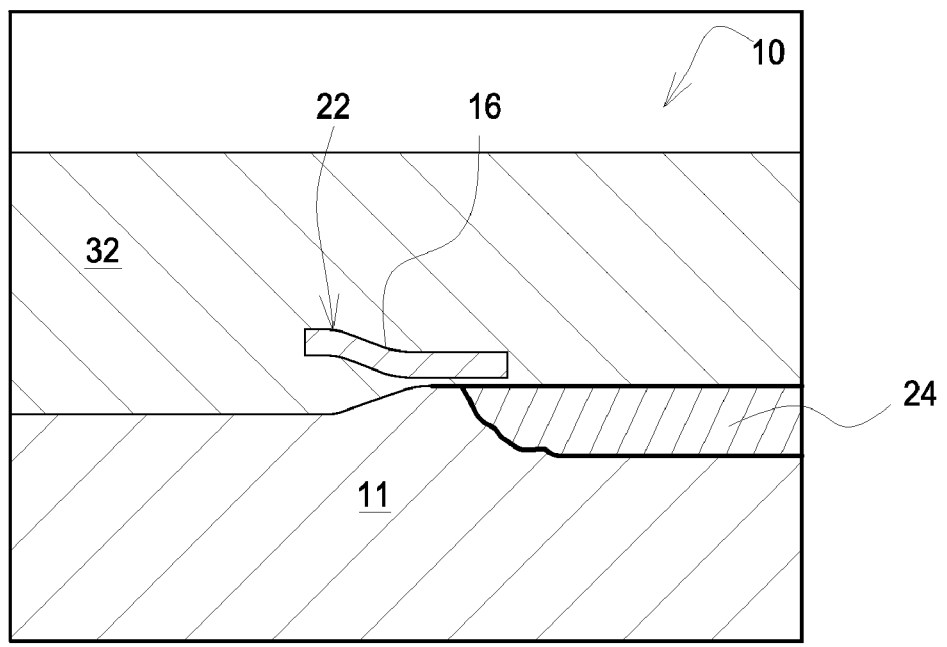

FIG. 1J illustrates NMOS transistor 10 following planarization of pre-metal dielectric layer 32. The cost and process time required for both the deposition and planarization of pre-metal dielectric layer 32 is proportional to the thickness and topography of the deposited layer. In prior art embodiments, either long polish times or additional steps, such as a reverse masking and etch operations, were required to planarize the pre-metal dielectric layer. These costs are minimized by the reduction in step height $n_5$ associated with the present invention, and the subsequent reduction in the thickness and topography of pre-metal dielectric layer 32.

The present invention therefore provides a fabrication process that reduces the overall wafer topography while still providing characteristics (e.g., favorable blocking ratio) desirable for high-voltage MOS devices. In particular, providing a sacrificial nitride layer having a thickness larger than that of the gate oxide layer improves the blocking ratio associated with the LDD implantation of source/drain regions. In addition, proper selection of the thicknesses associated with the sacrificial nitride layer and the gate oxide layer results in a subsequent etch of these materials being performed without corresponding damage to the polysilicon layer.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A method of forming a metal-oxide semiconductor (MOS) transistor on a wafer, the method comprising:
    forming a gate oxide region and a field oxide region on a substrate, wherein the gate oxide region has a thickness of at least 400 Angstroms;
    forming a polysilicon layer on the gate oxide region and the field oxide region;
    forming a sacrificial nitride layer on the polysilicon layer, wherein the sacrificial nitride layer has a thickness approximately equal to or greater than a thickness of the gate oxide region;
    forming a polysilicon gate by selectively removing portions of the polysilicon layer and the sacrificial nitride layer to expose a portion of the gate oxide region adjacent to the polysilicon gate;
    forming source/drain regions adjacent to the polysilicon gate using lightly-doped drain (LDD) implantation;
    forming a spacer layer over the polysilicon gate and source/drain region;
    selectively removing the spacer layer, the sacrificial nitride layer, and the gate oxide region located over the source/drain region to form sidewall spacers at each end of the polysilicon gate;
    forming a pre-metal dielectric layer on the high-voltage MOS transistors; and
    planarizing the pre-metal dielectric layer.

2. The method of claim 1, wherein the thickness of the sacrificial nitride layer is less than or equal to twice the thickness of the gate oxide region.

3. The method of claim 1, wherein a thickness of the polysilicon layer is less than three times the thickness of the gate oxide region.

4. The method of claim 1, wherein selectively removing the spacer layer includes performing an anisotropic etch in which removal of the sacrificial nitride layer coincides with removal of the gate oxide region to prevent undesirable etching of the polysilicon layer.

5. The method of claim 4, wherein the thickness of the gate oxide region and the thickness of the sacrificial nitride layer are selected such that removal of the sacrificial nitride layer coincides with removal of the gate oxide region.

6. A metal-oxide semiconductor (MOS) transistor prepared by the process of claim 1.

7. A method of forming a metal-oxide semiconductor (MOS) transistor on a wafer, the method comprising:
    forming a gate oxide region and a field oxide region on a substrate, wherein the gate oxide region has a thickness of at least 400 Angstroms;
    forming a polysilicon layer on the gate oxide region and the field oxide region, wherein the polysilicon layer has a thickness less than or equal to three times a thickness of the gate oxide region;
    forming a sacrificial nitride layer on the polysilicon layer;
    forming a polysilicon gate by selectively removing portions of the polysilicon layer and the sacrificial nitride layer to expose a portion of the gate oxide region adjacent to the polysilicon gate;
    forming source/drain regions adjacent to the polysilicon gate using lightly-doped drain (LDD) implantation, wherein a combined thickness of the polysilicon layer and the sacrificial nitride layer is sufficient to protect a channel region underlying the polysilicon gate from LDD implantation;
    forming a spacer layer over the polysilicon gate and source/drain region;
    selectively removing the spacer layer, the sacrificial nitride layer, and the gate oxide region located over the source/drain region to form sidewall spacers at each end of the polysilicon gate;

forming a pre-metal dielectric layer on the high-voltage MOS transistors; and planarizing the pre-metal dielectric layer.

8. The method of claim 7, wherein the sacrificial nitride layer has a thickness approximately equal to or greater than the thickness of the gate oxide region.

9. The method of claim 7, wherein the sacrificial nitride layer has a thickness approximately equal to or less than twice the thickness of the gate oxide region.

10. A metal-oxide semiconductor (MOS) transistor prepared by a process of claim 7.

11. A method of forming a metal-oxide semiconductor (MOS) transistor on a wafer, the method comprising:

forming a gate oxide region and a field oxide region on a substrate, wherein the gate oxide region has a thickness $n_1$ of at least 400 Angstroms;

forming a polysilicon layer having a thickness $n_2$ on the gate oxide region and the field oxide region, wherein the thickness of the polysilicon layer is defined by a first equation:

$$n_2 \leq n_1 * 3, \text{ wherein } n_1 \text{ is greater than 400 Angstroms;}$$

forming a sacrificial nitride layer on the polysilicon layer, wherein the sacrificial nitride layer has a thickness $n_3$ defined by a first equation:

$$n_1 \leq n_3 \leq n_1 * 2;$$

forming a polysilicon gate by selectively removing portions of the polysilicon layer and the sacrificial nitride layer to expose a portion of the gate oxide region adjacent to the polysilicon gate;

forming source/drain regions adjacent to the polysilicon gate using lightly-doped drain (LDD) implantation;

forming a spacer layer over the polysilicon gate and source/drain region;

selectively removing the spacer layer, the sacrificial nitride layer, and the gate oxide region located over the source/drain region to form sidewall spacers at each end of the polysilicon gate;

forming a pre-metal dielectric layer on the high-voltage MOS transistors; and planarizing the pre-metal dielectric layer.

12. A metal-oxide semiconductor (MOS) transistor prepared by the process of claim 11.

* * * * *